(12) United States Patent
Oh

(10) Patent No.: US 10,701,809 B2
(45) Date of Patent: Jun. 30, 2020

(54) FLEXIBLE PRINTED CIRCUIT BOARD AND DISPLAY APPARATUS INCLUDING THE SAME

(71) Applicant: LG Display Co., Ltd., Seoul (KR)

(72) Inventor: Changseok Oh, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/190,045

(22) Filed: Nov. 13, 2018

(65) Prior Publication Data
US 2019/0159342 A1    May 23, 2019

(30) Foreign Application Priority Data
Nov. 20, 2017  (KR) .................. 10-2017-0154995

(51) Int. Cl.
*H05K 1/18*  (2006.01)
*H05K 1/03*  (2006.01)
*H05K 1/02*  (2006.01)

(52) U.S. Cl.
CPC .......... *H05K 1/189* (2013.01); *H05K 1/0281* (2013.01); *H05K 1/0393* (2013.01); *H05K 2201/05* (2013.01); *H05K 2201/052* (2013.01); *H05K 2201/09063* (2013.01); *H05K 2201/09181* (2013.01); *H05K 2201/10128* (2013.01)

(58) Field of Classification Search
CPC ................. H05K 1/189; H05K 1/0281; H05K 2201/09172
See application file for complete search history.

(56) References Cited

U.S. PATENT DOCUMENTS

| 8,576,210 | B2 | 11/2013 | Yang et al. | |
| 9,465,467 | B2 * | 10/2016 | Lee | G06F 3/041 |
| 9,703,057 | B2 * | 7/2017 | Tsujita | H05K 1/0274 |
| 2006/0109394 | A1 * | 5/2006 | Miyagawa | G02F 1/13452 |
| | | | | 349/58 |
| 2018/0063968 | A1 * | 3/2018 | Holec | H05K 1/189 |

FOREIGN PATENT DOCUMENTS

KR  10-2008-0059836 A   7/2008
KR       10-1739804 B1   5/2012

* cited by examiner

*Primary Examiner* — William H. Mayo, III
*Assistant Examiner* — Hiram E Gonzalez
(74) *Attorney, Agent, or Firm* — Fenwick & West LLP

(57) ABSTRACT

A flexible printed circuit board that can reduce detachment when a flexible printed circuit board is attached to a display panel, and reduce a work cost, and simplify process, and reduce a tearing of the flexible printed circuit board due to a stress concentrated on a specific area of the flexible printed circuit board, and a display apparatus including the same. The flexible printed circuit board includes a base film having a notch at one side, on at least one side, and a plurality of rows of impact absorbing parts spaced apart from each other along the edge of the notch. The impact absorbing part provides a pattern layer one surface or both surfaces of the base film or a pattern hole of penetrating through the base film.

18 Claims, 12 Drawing Sheets

FLEXIBLE PRINTED CIRCUIT BOARD AND DISPLAY APPARATUS INCLUDING THE SAME

CROSS-REFERENCE TO RELATED APPLICATION

This application claims priority to the benefit of Republic of Korea Patent Application No. 10-2017-0154995, filed on Nov. 20, 2017, the disclosure of which is incorporated herein by reference in its entirety.

BACKGROUND

1. Field of the Disclosure

The present disclosure relates to a flexible printed circuit board which can improve an attachment quality with a display panel, and a display apparatus including the same.

2. Description of Related Art

Generally, a display apparatus includes a display panel that realizes an image, and a driver circuit part that generates various signals necessary for an image realization of the display panel. Also, the driving circuit part includes a data driver, a gate driver for driving the display panel, a timing controller of controlling the gate driver and the data driver, and a power supply.

The driving circuit part may be generally mounted on a printed circuit board separate from the display panel and electrically connected to the display panel through a flexible printed circuit board such as an FPC (flexible printed circuit), or may be mounted on the flexible printed circuit board such as a COF (chip on film) and electrically connected to the display panel.

Meanwhile, the flexible printed circuit board such as the FPC or the COF connected to the display panel is bent backward the display panel to reduce a display bezel. In order that, a plastic substrate having a flexibility such as polyimide (PI) may be used.

However, a polyimide board has a low adhesion between the layers stacked on a board compared to the glass board, thus it has a problem that the flexible printed circuit board such as the FPC or the COF attached to the display panel is easily separated by an external force. In particular, when the external force is applied to a side of the flexible printed circuit board, there arise the problems that the flexible printed circuit board is easily detached, or torn even with a small force.

In order to solve such problems, in conventional, various complementary methods as shown in FIG. 1 have been used. First, as in FIG. 1A, when an electrode part 22 of the flexible printed circuit board 20 is attached to an electrode pad part 10 of the display panel, there is a method of additionally preparing an extended part 24 extended from the side of the attached area of the flexible printed circuit board 20 to disperse a stress by the external force. However, in this case, there are the problems that a signal interference with the display panel is generated by the extended part 24 and it is difficult to realize a narrow bezel. Further, when a wiring of the display panel is disposed in an area of the extended part 24, a crack is generated due to a pressure.

Next, as shown in FIG. 1B, there is also a method of additionally attaching a detachment prevention tape 30 to the attachment area of the flexible printed circuit board 20 and the electrode pad part 10 of the display panel to prevent a detachment. However, in this case, since it is necessary to provide a separate detachment prevention tape 30, there is a problem that a process efficiency is lowered due to an increase in manufacturing cost and a generation of an additional work. In addition, due to a high adhesive force of the detachment prevention tape 30, there is a problem that a plastic substrate defect are easily generated during reworking for detachment.

Accordingly, the present disclosure is to solve the conventional problems and it is to provide a flexible printed circuit board capable of improving the attachment quality of a flexible printed circuit board such as the FPC, and the COF.

SUMMARY OF THE DISCLOSURE

Embodiments of the present disclosure relate to a flexible printed circuit board including a base film and a plurality rows of impact absorbing part. The base film has a notch on one side of the flexible printed circuit board. The rows of impact absorbing parts spaced apart from each other along an edge of the notch.

In some example embodiments, the impact absorbing part is a pattern layer arranged on one surface or both surfaces of the base film. The pattern layer may also be arranged on both surfaces of the base film and staggered relative to each other.

In some example embodiments, the plurality of impact absorbing parts are spaced apart from each other. The plurality of impact absorbing parts may be arranged in different rows and staggered from each other.

In some example embodiments, the impact absorbing part is a pattern hole penetrating through the base film and a protective layer covering the pattern hole.

Embodiments also relate to a display apparatus includes a display panel, a flexible printed circuit electrically connected to the display panel on a first side, the flexible printed circuit having a base film having a notch on a second side of the flexible printed circuit, a plurality of rows of impact absorbing parts spaced apart from each other along an edge of the notch, and a printed circuit board which is electrically connected to a third side of the flexible printed circuit board, the second side between the third side of the first side.

In some example embodiments, the flexible printed circuit board is one of a plurality of flexible printed circuit boards that are arranged in parallel along the display panel, the notch and the impact absorbing parts on the second side of the flexible printed circuit board.

In some example embodiments, the notch overlaps an edge of the display panel at which the flexible printed circuit board makes contact with the display panel.

Embodiments also relate to a flexible printed circuit board including a base film formed with a first notch at a first side, the first notch configured to dissipate stress at an attachment area of the base film attached to a substrate, and an impact absorbing part of the base film that extends along an edge of the notch, the impact absorbing part configured to absorb stress concentrated at the notch.

In some example embodiments, the impact absorbing part includes a metal layer on the base film and a protective layer on the metal layer.

In some example embodiments, the metal layer is made of a same material as an electrode pattern on the flexible printed circuit board.

In some example embodiments, the impact absorbing part includes a portion of the base film formed with a pattern hole penetrating through the portion of the base film, and a protective layer covering the pattern hole.

In some example embodiments, the base film is formed with a second notch on a second side opposite to the first side such that the base film is symmetrical.

In some example embodiments, the flexible printed circuit board has another impact absorbing part on the base film that extends along the edge of the notch.

In some example embodiments, the impact absorbing part is at a first distance from the edge of the notch and the other impact absorbing part is disposed at a second distance from the edge of the notch, the second distance greater than the first distance.

In some example embodiments, the impact absorbing part is on a first surface of the base film and the other impact absorbing part is on a second surface of the base film opposite to the first surface.

In some example embodiments, each of the impact absorbing part and the other impact absorbing part is made of disconnected strips.

In some example embodiments, at least a portion of the first notch overlaps with an edge of the substance.

In some example embodiments, an output pad area electrically connects to an electrode of the substrate that is a display panel, and an input pad part connects to a separate printed circuit board that supplies signals to the substrate via the flexible printed circuit board.

DETAILED DESCRIPTION OF EXEMPLARY EMBODIMENTS

Figure 1A:
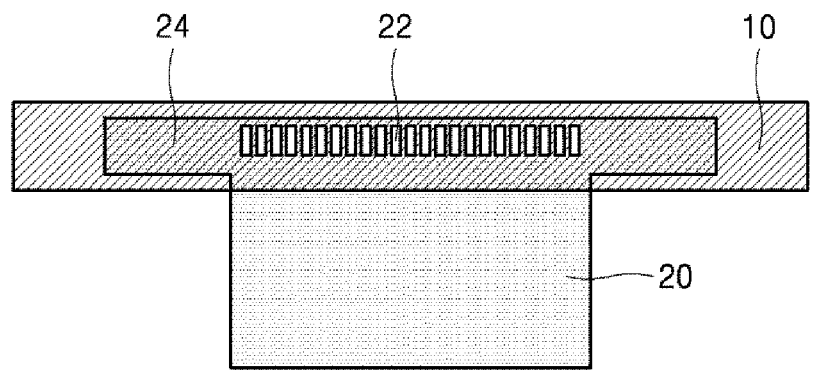
FIGS. 1A and 1B are views illustrating a conventional flexible printed circuit board attached to an electrode pad part of a display panel.
Figure 1B:
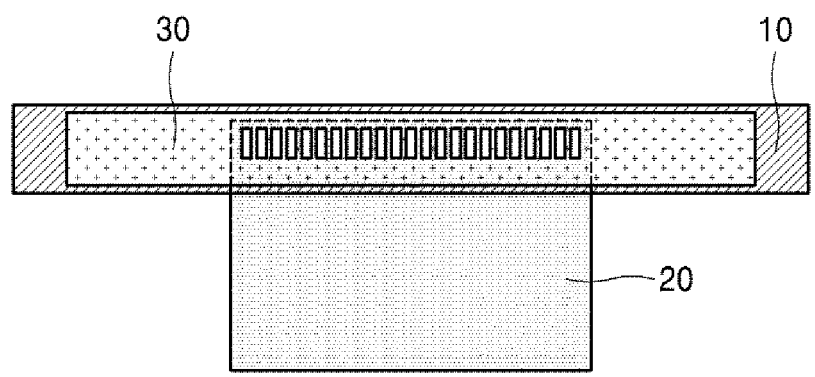

Hereinafter, the embodiments according to the present disclosure will be described in detail with reference to the accompanying drawings. In the drawings, the same reference numerals are used to indicate the same or similar components.

Hereinafter, any configuration is provided or arranged in "an upper part (or a lower part)" of a substrate or an "on (or below)" of the substrate means that any configuration is provided or arranged in contact with an upper surface (or a lower surface) of the board, and it is not limited to not including other configuration between the board and any configuration provided or arranged on (or below) the board.

When a component is described as being "connected", "coupled", or "accessed" to another component, the component may be directly connected to or connected to the other component, however, it is to be understood that other component may be "interposed" between each component, or each component may be "connected", "coupled", or "accessed" via other components.

FIGS. 2A-2D illustrate various embodiments of a flexible printed circuit board in accordance with an exemplary embodiment of the present disclosure. The flexible printed circuit board 100 according to the present disclosure includes a base film 110 made of a flexible plastic material such as polyimide (PI). Since the base film 110 is made of a flexible material, the printed circuit board connected to one side of the flexible printed circuit board 100 can be folded back to the display panel connected to other side or other printed circuit board.

The shape of the base film 110 generally has a rectangular as a basic shape, but may vary depending on an arrangement shape of the electrodes to be required and the shape of the substrate to be contacted as shown in FIG. 2

An output pad part 170 having a plurality of electrode patterns is provided on one side of the base film 110 and an input pad part 180 having a plurality of electrode patterns extended from the electrode patterns of the output pad part 170 is provided on other side of the base film 110 on which the output pad part 170 is disposed.

In the present disclosure, the positions of the output pad part 170 and the input pad part 180 are distinguished according to the input and output signals of the panels or the printed circuit boards connected to one side and other side of the flexible printed circuit board 100, and the positions of the output pad part 170 and the input pad part 180 may be changed. A separate connector for a connection to the display panel or the printed circuit board can be formed in the output par part 170 and the input pad part 180.

The output pad part 170 and the input pad part 180, which the electrode parts are formed in one side and other side of the base film 110 are formed. However, for the reasons such as an interference problem between the electrode part and other printed circuit boards, it is preferable that an entire surface of the base film 110 is not formed as an electrode part. Accordingly, an electrode unformed part which is not formed with the electrode part is provided in both sides of the base film 110.

At least one side of the base film 110, that is, the electrode unformed part, is provided with a notch 120 inserted inward the base film 110 from one side. The notch 120 may be provided on one side of the base film 110 and it is preferable that the notchs 120 on both sides may be provided in a symmetrical position and shape to each other.

In the present disclosure, the notch 120 is formed on the side of the base film 110 in a position close to the output pad part 170, but depending on the type of the display panel or the printed circuit board attached to the pad part, it may be also formed on the side of the base film 110 in a position close to the input pad part 180. As necessary, the notch 120 may be provided in all both sides of the output pad part 170 and the input pad part 180.

In the present disclosure, when the output pad part 170 of the flexible printed circuit board 100 is attached to the electrode pad part of the display panel, the embodiments with regard to having the notch 120 on the side of the base film 110 in a position close to the output pad part 170 will be explained in detail.

Figure 2A:
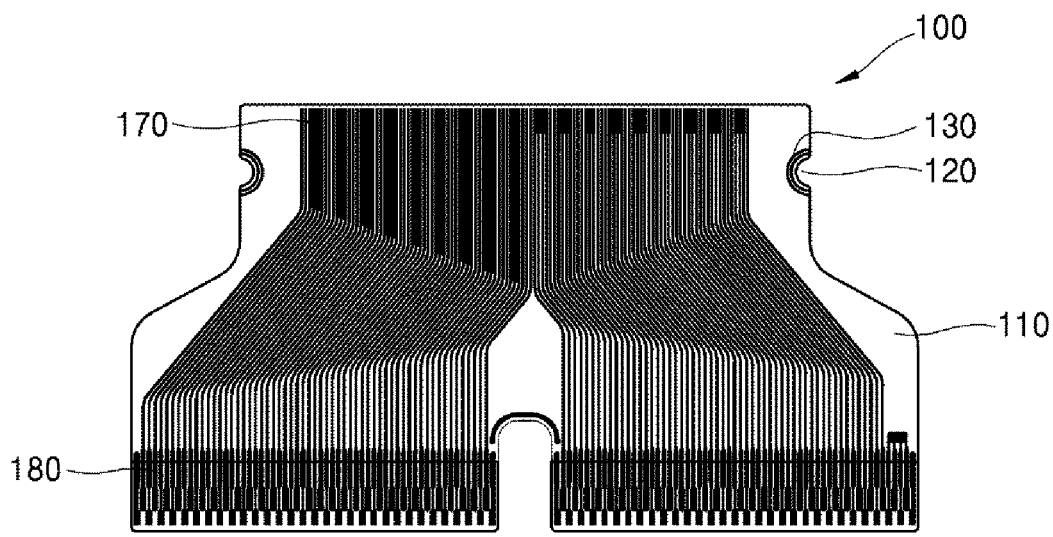
FIGS. 2A-2D illustrate a flexible printed circuit board in accordance with various embodiments of the present disclosure.
Figure 2B:
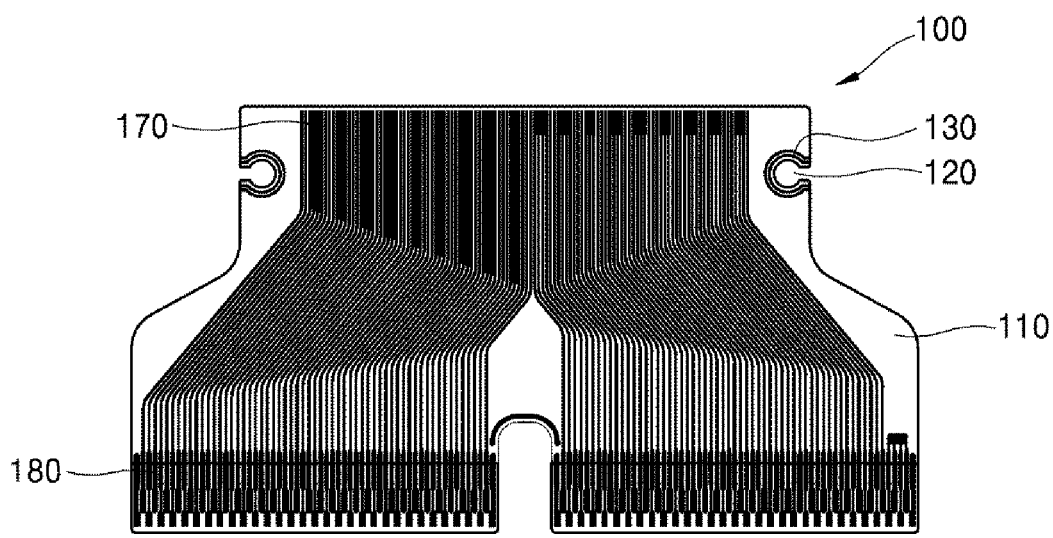
Figure 2C:
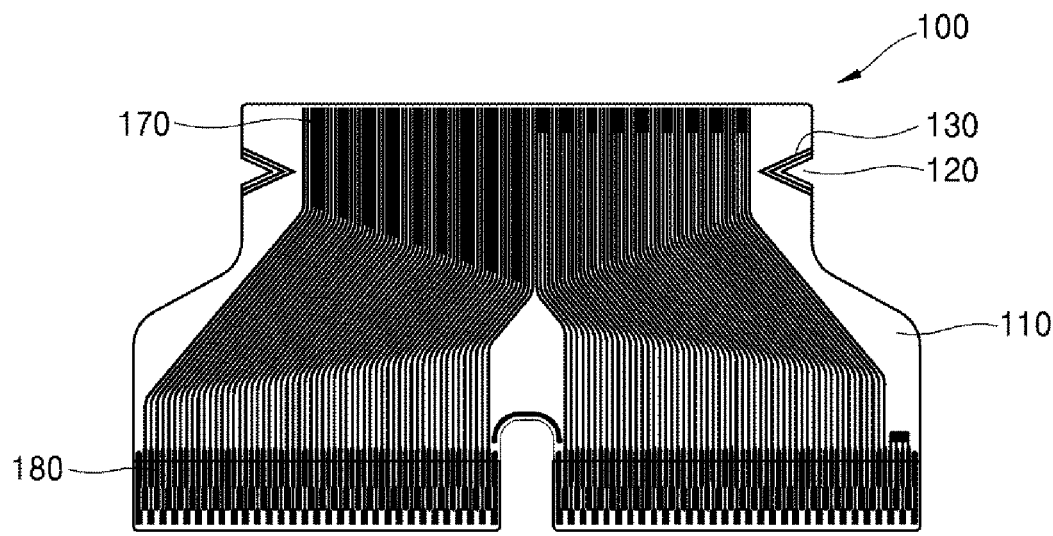
Figure 2D:
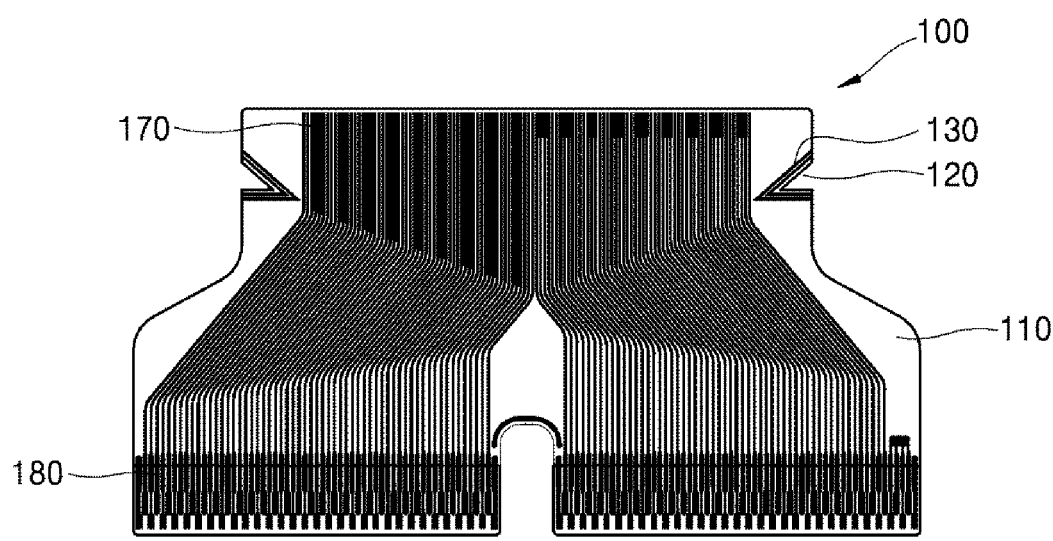

The notch 120 provided on at least one side of the base film 110 serves to disperse the stress primarily when the stress is applied to a display panel in a lateral direction of the flexible printed circuit board 100. The shape of the notch 120 may have various shapes such as a semicircular shape as shown in FIG. 2A, a hole shape having a linear-shaped inlet part as shown in FIG. 2B, a wedge shape as shown in FIG. 2C, and a half-wedge shape as shown in FIG. 2D, and the shapes are not particularly limited.

When the stress is continuously applied or a momentary force is significantly applied with concentrated, to the flexible printed circuit board 100, since the stress is applied to the specific area such as the notch 120, and the flexible printed circuit board 100 may tear more easily along the notch 120. In addition, the flexible printed circuit board 100 is damaged or detached from the display panel, generating a defect.

Accordingly, in order to block the stress concentrated on the notch 120 and to secondarily disperse the stress applied from the outside to secure the quality of the flexible printed circuit board 100, the present disclosure includes a plurality of rows of impact absorbing parts 130 arranged to be spaced apart from each other in the periphery of the notch 120.

Figure 3A:
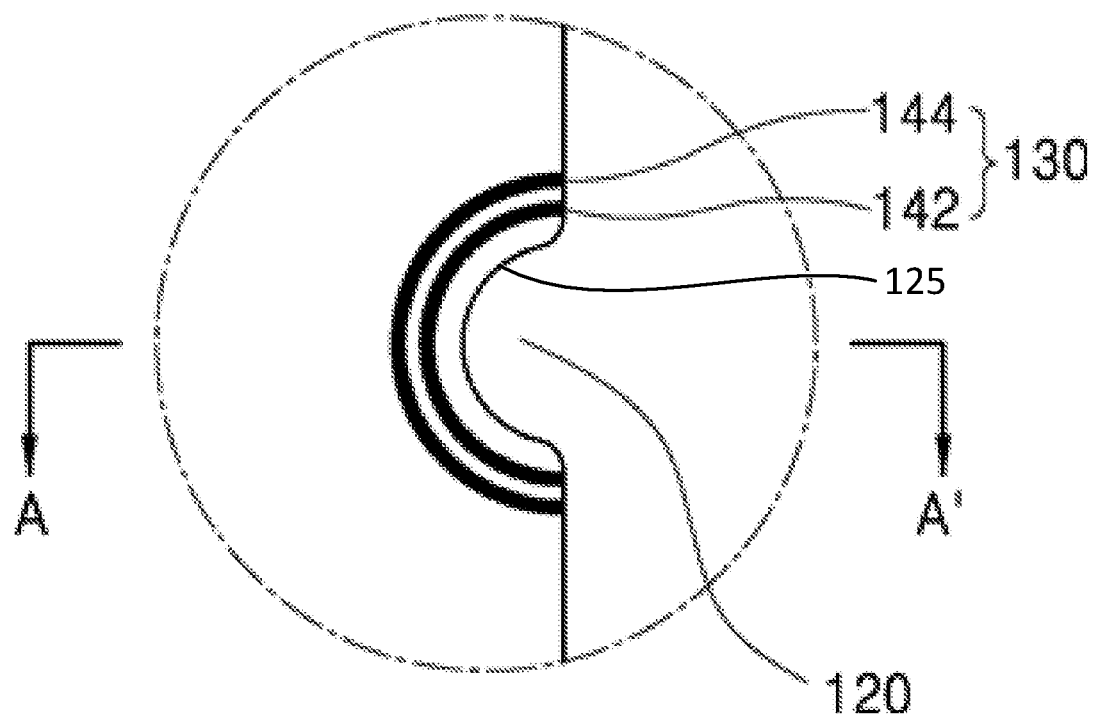
FIGS. 3A to 6B are enlarged views and cross-sectional views of an impact absorbing part of a flexible printed circuit board in accordance with various embodiments of the present disclosure.
Figure 3B:
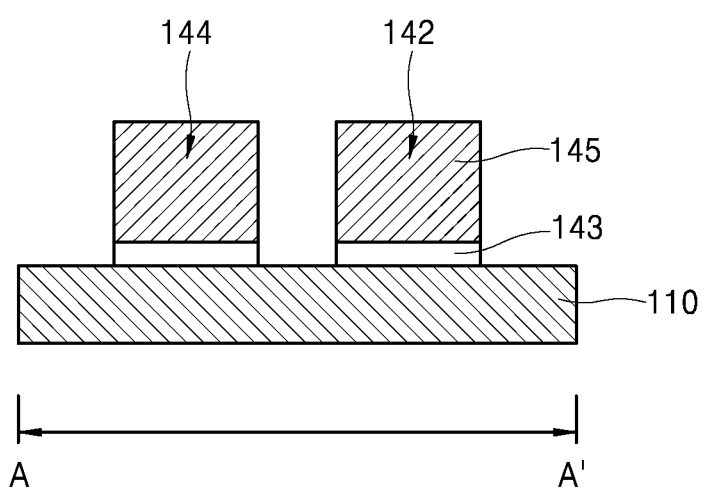

FIGS. 3A and 3B are an enlarged view and a cross-sectional view which enlarge an embodiment of the impact absorbing part 130, and they will be described in detail with reference to them.

The impact absorbing part 130 may be arranged on one side or both sides of the base film 110. In one embodiment according to FIG. 3, the impact absorbing part 130 is provided on only one surface of the base film 110.

The notch 120 has an edge 125 that curves in towards a center of the base film 110. The first pattern layer 142 and the second pattern layer 144 are arranged to be spaced apart from each other along the edge 125 of the notch. At this time, the pattern layer may be further arranged additionally, in addition to the first pattern layer 142 and the second pattern layer 144, and the plurality of rows of pattern layers are arranged to be spaced apart from each other to form the impact absorbing part 130.

The pattern layer is provided with at least two or more patterns so that a force by the stress concentrated on the notch 120 is effectively blocked and a diffusion is prevented and it is preferable that a plurality of rows are provided.

In the case of the pattern layer, it may be provided with a pattern that the metal layer 143 is provided on the film 110. It is preferable that the metal layer 143 is formed simultaneously when forming the electrode pattern of the flexible printed circuit board 100.

When forming the metal layer 143 in a pattern layer, there is an advantage that can be formed at once without an additional material and an addition of the process by forming it with the same process and material, not forming it with the separate process and material from the electrode patterns of the flexible printed circuit board 100.

Specifically, a metal film such as a copper foil covering the base film 110 is formed by the method of one embodiment of forming the electrode of the flexible printed circuit board, and then the metal layer 143 of the impact absorbing part 130 and the electrode pattern can be simultaneously formed through one mask process using photolithography. The metal layer 143 of the impact absorbing part 130 is a dummy pattern which is not connected with the electrode pattern.

A protective layer 145 such as a coverlay may be added additionally on the metal layer 143 of the impact absorbing part 130. As the protective layer 145 is added on the metal layer 143, a thickness of each of the pattern layers of the impact absorbing part 130 becomes thicker so that a moving path of the stress becomes longer, and thus, the stress concentrated on the notch 120 can be more effectively blocked and dispersed.

When the coverlay serving as the protective layer 145 is formed to cover the front surface part except the output pad part or the input pad part connected to the other printed circuit board or the display panel in the flexible printed circuit board, there is an advantage that the coverlay can be formed on the metal layer 143 of the pattern layer without using a separate process or material for only the pattern layer of the impact absorbing part 130.

In addition, the protective layer 145 can prevent the electrode parts on the base film 110 from being electrically shorted to each other, and it can minimize a corrosion due to an exposure of the electrode parts in the air.

Figure 4A:
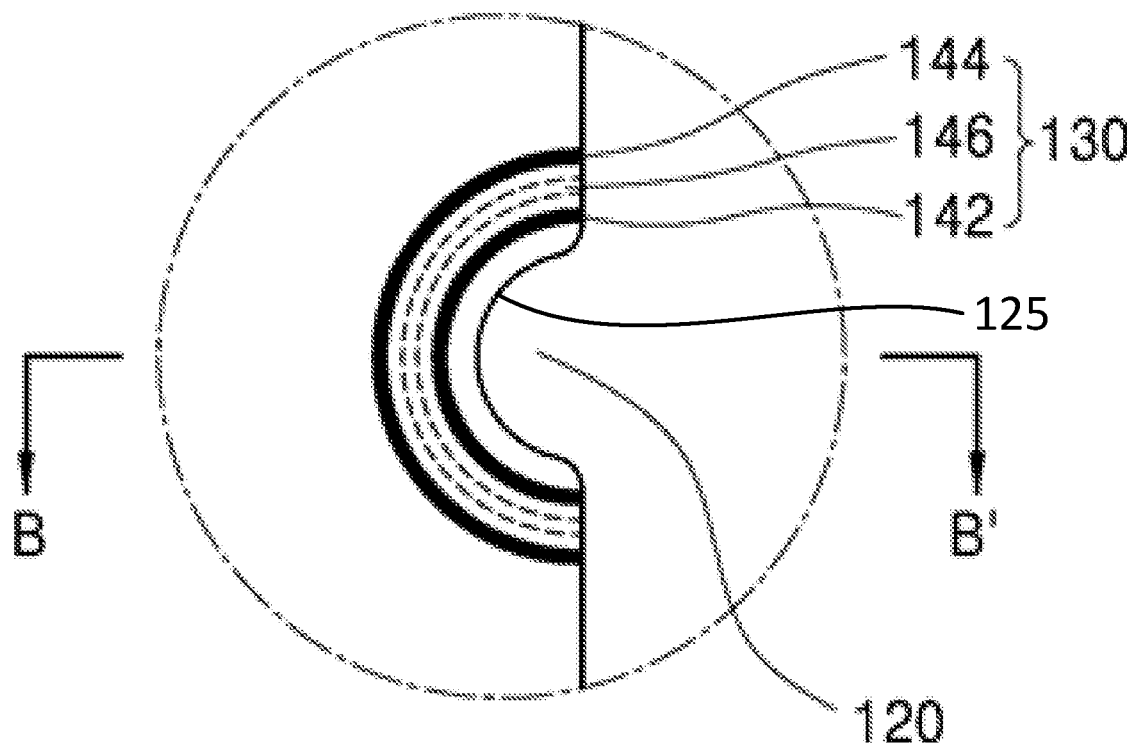
Figure 4B:
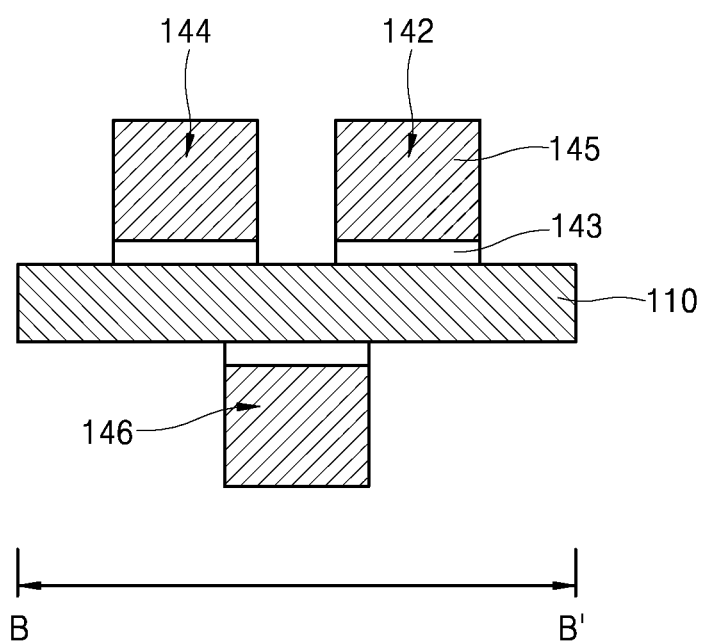

FIGS. 4A and 4B are an enlarged view and a cross-sectional view of the flexible printed circuit board in accordance with other embodiment of the present disclosure in which the impact absorbing part 130 is provided on both surfaces of the base film 110. In the following, the contents overlapped in the above-mentioned contents will be omitted, and the difference will be mainly and specifically explained.

The notch 120 has an edge 125 that curves in towards a center of the base film 110. The impact absorbing part 130 may be provided on both sides of the base film 110 along the edge 125 and it is preferable that the pattern layers forming the impact absorbing part 130 are arranged to be staggered from each other. Specifically, a first pattern layer 142 and a second pattern layer 144 are provided to be spaced apart from each other on one surface of the base film 110 and a third pattern layer 146 arranged between the first pattern layer 142 and the second pattern layer 144 is provided on other side.

The pattern layer arranged on one side of the base film 110 and the pattern layer arranged on other side may be arranged so that some areas overlap with each other, but may be arranged so as not to overlap with each other. It is not particularly limited with regard to the arrangement position about the pattern layers on both surfaces, but it is preferable that the position from each other is arranged to be staggered from each other.

For example, it is preferable that the third pattern layer 146 is arranged in an asymmetrical form such that the position from each other is staggered from each other, rather than that it is arranged in a symmetrical form in a position arranged with the first pattern layer 142 or the second pattern layer 144.

A path of the stress that is diffused through the notch 120 by the pattern layers arranged to be staggered on both surfaces of the base film 110 can be further complicated, thereby making the blocking effect and the diffusion prevention effect more effective.

Figure 5A:
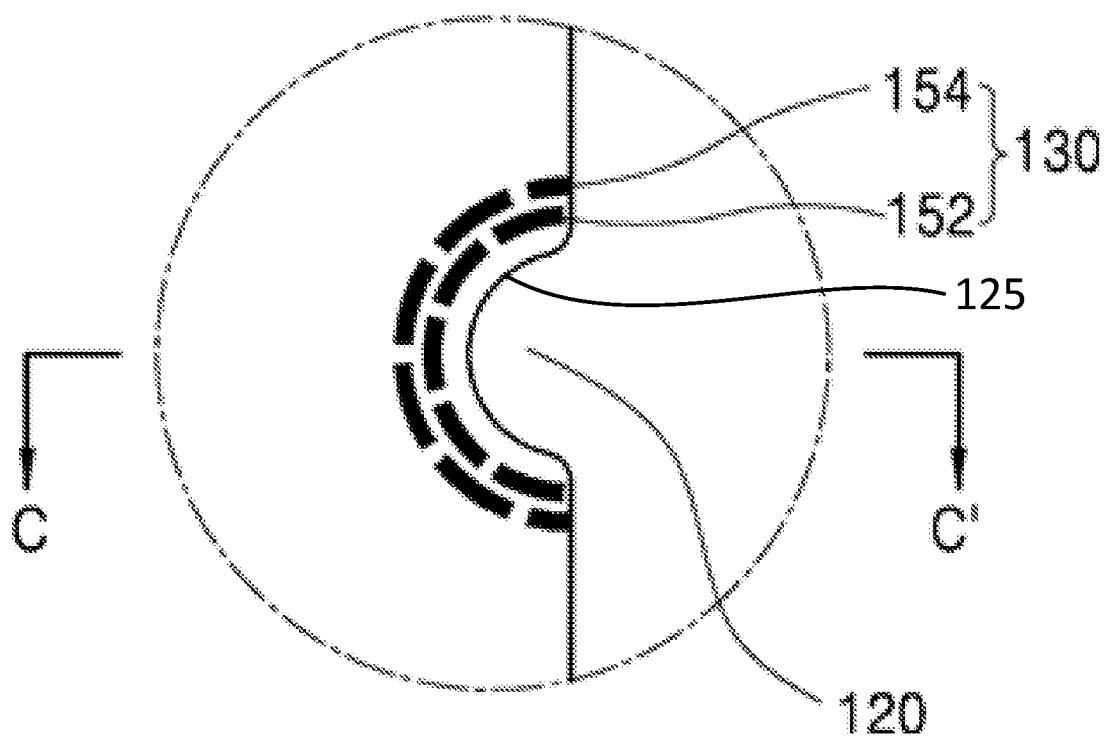
Figure 5B:
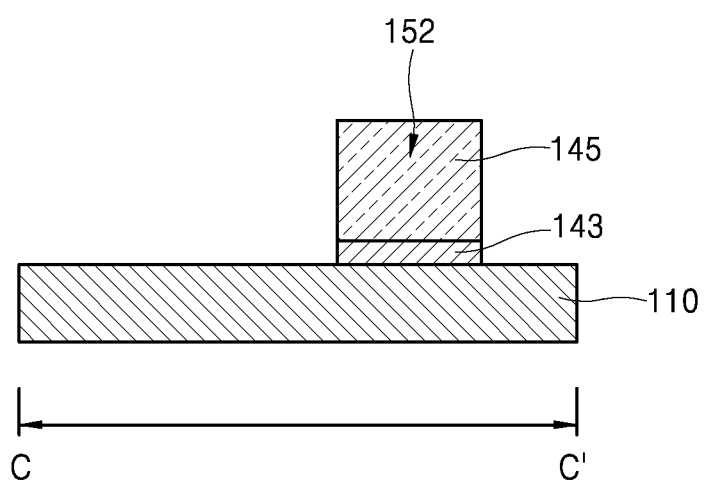

FIGS. 5A and 5B illustrate a flexible printed circuit board in accordance with another embodiment of the present disclosure. A plurality of pattern layers, which are the impact absorbing parts arranged in a row, are arranged to be spaced apart from each other.

Specifically, the pattern layer is arranged in a plurality of rows, and each of the pattern layer has a plurality of spaced pattern layers even in a row.

That is, the pattern layer of the first row has a 1-1 pattern layer 152, a 1-2 pattern layer, and the (1-n)th layers and they are arranged to be spaced apart from each other. The pattern low in the second row also provides the 2-1 pattern layer 154, a 2-2 pattern layer, and a (2-m)th pattern layers and the plurality of pattern layers are arranged to be space from each other in a row.

It is preferable that the pattern layers arranged in different rows from each other are arranged to be staggered from each other. For example, the 2-2 pattern layer of the second row is arranged between the 1-2 pattern layer and the 1-1 pattern layer 152 of the first row, and it is preferable that the pattern layers in the different rows from each other is arranged in the asymmetrically staggered form from each other, not symmetrically.

This is to further complicate the path of the stress which is diffused through the notch 120 by the pattern layers arranged to be staggered, thereby making the blocking effect and the diffusion preventing effect more effective.

Figure 6A:
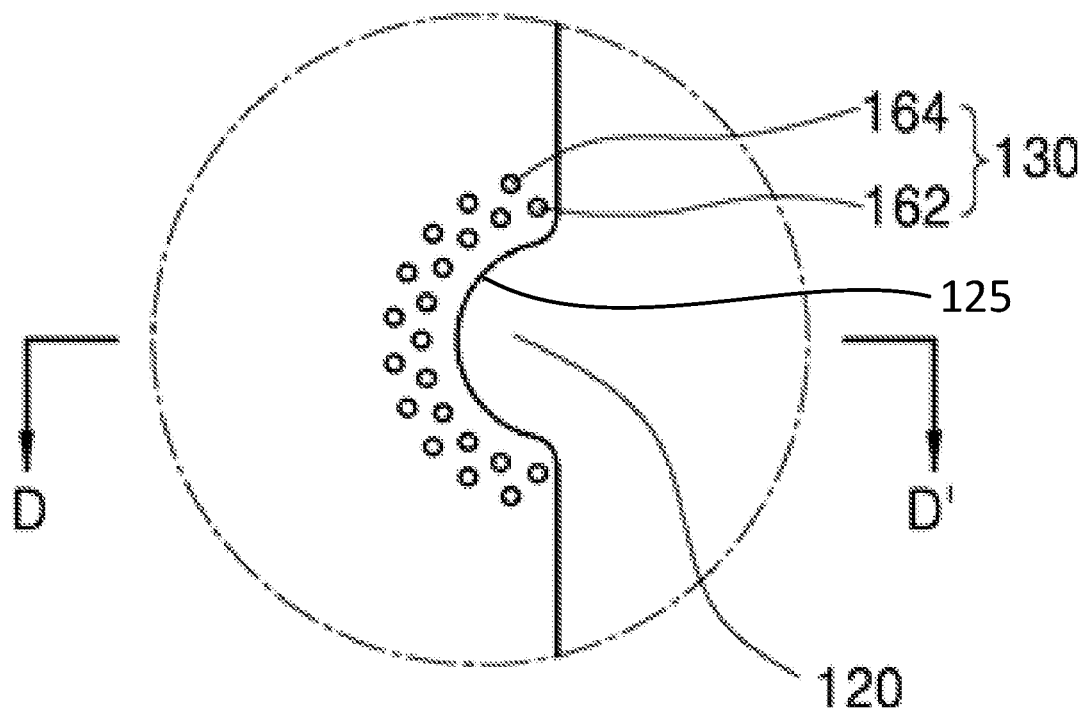
Figure 6B:
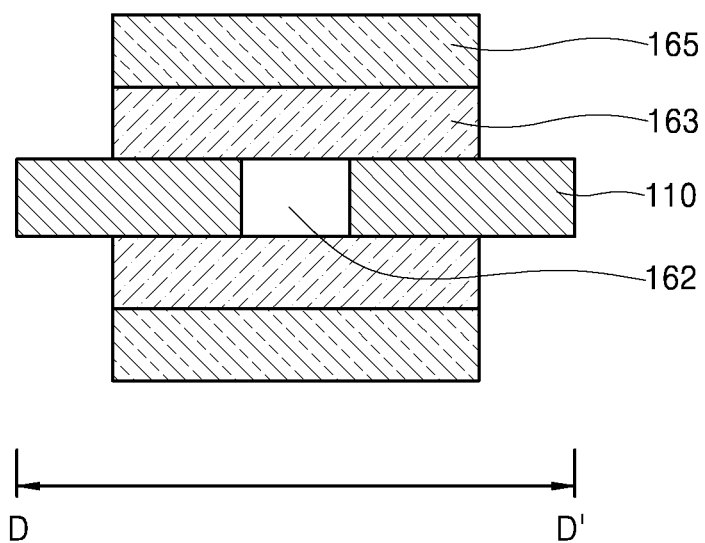

FIGS. 6A and 6B illustrate a flexible printed circuit board in accordance with another embodiment of the present disclosure. The impact absorbing part 130 is provided in a form of a pattern hole penetrating through the base film 110.

The notch 120 has an edge 125 that curves in towards a center of the base film 110. The impact absorbing part 130 along the edge 125 of the notch 120 may be provided in the form of a pattern hole penetrating through the base film 110. It is preferable that the pattern of the pattern hole is also formed in a plurality of rows along the shape of the notch 120.

Specifically, in the case of the pattern holes arranged in the first row disposed with the first pattern hole 162 and arranged in the second row disposed with the second pattern hole 164, it is preferable that they are arranged to be spaced apart from each other, and in the case of the pattern holes arranged in the first row, which is same as the first pattern hole 162 are arranged to be spaced from each other.

In addition, it is preferable that the pattern hole in the second row is arranged between the adjacent pattern holes arranged in the first row, and the pattern holes arranged in the different rows from each other are arranged to be staggered from each other.

As described above, the path of the stress diffused through the notch 120 by the pattern holes arranged to be staggered can be further complicated, thereby making the blocking effect and the diffusion prevention effect more effective. That is, since the pattern hole provided in the base film 110 has an effect of cutting off the path of the stress that is moved through the notch 120 to block, it is preferable that it is formed in a pattern which makes the moving path of the stress long and complicated at most.

The pattern hole may be formed by using a laser or may use a method of drilling the hole by a through-via drill. In addition, the coverlay such as the protective layer 165 can be formed to cover the pattern hole on one surface or both surfaces of the pattern hole. The protective layer 165 has the attaching layer 163 and can be attached to the base film. In addition, the protective layer may be formed on the pattern hole by patterning a coating solution such as PSR (photo imageable solder resist).

The attaching layer 163 may use an acrylic resin or an epoxy resin or a mixture thereof, but is not limited thereto.

In particular, since the protective layer 165 such as a coverlay is firmed on both sides of the pattern hole, the stress that is diffused through the notch 120 can be dispersed by the coverlay on both surfaces, and the path of the stress is further complicated, thereby making the blocking effect and the diffusion prevention effect more effective.

Figure 7:
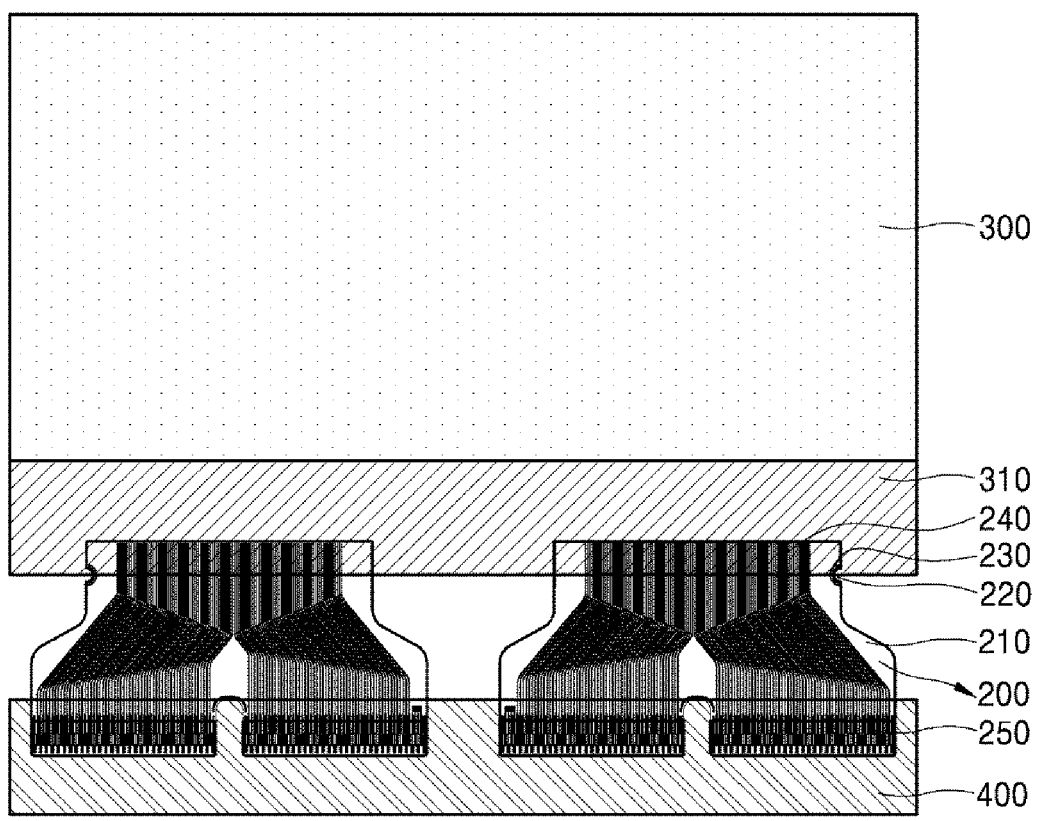
FIG. 7 is a view illustrating a plurality of flexible printed circuit boards in accordance with an exemplary embodiment of the present disclosure attached to an electrode pad part of a display panel and a printed circuit board.

FIG. 7 illustrates a plurality of flexible printed circuit boards in accordance with an exemplary embodiment of the present disclosure attached to a pad part of a display panel and a printed circuit board, and will be described in detail with reference to the drawings in the following.

The display panel 300 of realizing an image generally includes a plurality of signal wirings such as a gate wiring and a data wiring configured to cross each other, a thin film transistor switching element formed at the intersection part, and a pixel electrode. The electrode pad part 310 is provided which is electrically connected to the external driving circuit of transmitting the signal to the panel on one side of the display panel 300.

A flexible printed circuit board 200 includes a base film 210 made of a flexible plastic material such as polyimide (PI). One side of the flexible printed circuit board 200 in accordance with an exemplary embodiment of the present disclosure is electrically connected to the electrode pad part 310 of the display panel 300 through an output pad part 240 and other side of the flexible printed circuit board 200 is electrically connected to a separate printed circuit board 400 of inputting the signal through an input pad part 250, such as the external driving circuit. Since the base film 210 is made of a flexible material, the printed circuit board connected to the one side of the flexible punted circuit board 400 can be folded back to the display panel.

Although one flexible printed circuit board 200 may be provided to electrically connect the electrode pad part 310 of the display panel 300 and the separate printed circuit board 400, the plurality of the flexible printed circuits are provided to be a connection medium of electrically connecting the display panel 300 and the printed circuit board 400.

When the flexible printed circuit board 200 is attached to the electrode pad part 310 of the display panel 300, it is preferable that the notch 220 of the flexible printed circuit board 200 is provided to be overlapped at a boundary line between the display panel 300 and the flexible printed circuit board 200.

Since most of the external stress is applied about the area to which the display panel 300 and the flexible printed circuit board 200 are attached, the stress is strongly concentrated on the boundary line area, and the notch 220 and the impact absorbing part 230 are formed to the corresponding area to prevent the external stress and prevent diffusion.

In addition, when the plurality of flexible printed circuit boards 200 are arranged in parallel and attached to the display panel 300, the impact absorbing part 230 may be provided only in outermost one side of each flexible printed circuit board 200 arranged to the outermost.

In the case where a plurality of flexible printed circuit boards 200 are provided, since the stress is not substantially applied to the flexible printed circuit board 200 which is arranged inside, other than the flexible printed circuit board 200 arranged at the outermost, the notch 220 and the impact absorbing part 230 can be provided only on the outermost side of each of the flexible printed circuit board 200 arranged at the outermost.

It is preferable that the notch 220 and the impact absorbing part 230 arranged on the outermost sides of both sides of the flexible printed circuit board 200 which are arranged in plurality are formed in a position and a form symmetrical to each other. When the notch 220 and the impact absorbing part 230 on both outermost sides are formed asymmetrically, it is preferable that it is formed symmetrically since it causes an imbalance in stress applied to both sides of the flexible printed circuits 200.

Although the embodiments of the present disclosure have been described above, various modifications and variations can be made in a level of those skilled in the art. Therefore, it will be understood that such modifications and variations are intended to be included within the scope of the present disclosure unless departing from the scope of the present disclosure.

What is claimed is:
1. A display apparatus, comprising:
 a display panel;
 a flexible printed circuit board electrically connected to the display panel on a first side, the flexible printed circuit board comprising:

a base film having a notch on a second side of the flexible printed circuit board, and a plurality of rows of impact absorbing parts spaced apart from each other along an edge of the notch; and a printed circuit board which is electrically connected to a third side of the flexible printed circuit board, the second side between the third side and the first side, wherein the notch overlaps an edge of the display panel at which the flexible printed circuit board makes contact with the display panel.

2. The display apparatus of claim 1, wherein the impact absorbing part is a pattern layer arranged on one surface or both surfaces of the base film.

3. The display apparatus of claim 2, wherein the pattern layers arranged on both surfaces of the base film are staggered relative to each other.

4. The display apparatus of claim 1, wherein the plurality of impact absorbing parts are spaced apart from each other.

5. The display apparatus of claim 4, wherein the impact absorbing parts are arranged in different rows and are staggered from each other.

6. The display apparatus of claim 1, wherein the impact absorbing part is a pattern hole penetrating through the base film and a protective layer covering the pattern hole.

7. The display apparatus of claim 1, wherein the flexible printed circuit board is one of a plurality of flexible printed circuit boards that are arranged in parallel along the display panel, wherein the notch and the impact absorbing part are provided on the second side of the flexible printed circuit board.

8. The display apparatus of claim 1, wherein the notch is configured to dissipate stress at an attachment area of the base film attached to a substrate; and the impact absorbing part is configured to absorb stress concentrated at the notch.

9. The display apparatus of claim 8, wherein the impact absorbing part includes a metal layer on the base film and a protective layer on the metal layer.

10. The display apparatus of claim 9, wherein the metal layer is made of a same material as an electrode pattern of the flexible printed circuit board.

11. The display apparatus of claim 8, wherein the impact absorbing part includes a portion of the base film formed with a pattern hole penetrating through the portion of the base film, and a protective layer covering the pattern hole.

12. The display apparatus of claim 8, wherein the base film is formed with a second notch on a second side opposite to the first side such that the base film is symmetrical.

13. The display apparatus of claim 8, further comprising another impact absorbing part on the base film that extends along the edge of the notch.

14. The display apparatus of claim 13, wherein the impact absorbing part is disposed at a first distance from the edge of the notch and the other impact absorbing part is disposed at a second distance from the edge of the notch, the second distance greater than the first distance.

15. The display apparatus of claim 13, wherein the impact absorbing part is on a first surface of the base film and the other impact absorbing part is on a second surface of the base film opposite to the first surface.

16. The display apparatus of claim 13, wherein each of the impact absorbing part and the other impact absorbing part is made of disconnected strips.

17. The display apparatus of claim 8, wherein at least a portion of the first notch overlaps with an edge of the substrate.

18. The display apparatus of claim 8, further comprising:

an output pad part configured to electrically connect to an electrode of the substrate, wherein the substrate is a display panel; and an input pad part configured to connect to a separate printed circuit board that supplies signals to the substrate via the flexible printed circuit board.

* * * * *